United States Patent
Moon et al.

(10) Patent No.: US 11,545,653 B2
(45) Date of Patent: Jan. 3, 2023

(54) DISPLAY DEVICE AND ELECTRONIC APPARATUS INCLUDING THE SAME

(71) Applicant: Samsung Display Co., Ltd., Yongin-si (KR)

(72) Inventors: Chanho Moon, Yongin-si (KR); Jaesik Kim, Yongin-si (KR); Jaeik Kim, Yongin-si (KR); Yeonhwa Lee, Yongin-si (KR); Joongu Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 171 days.

(21) Appl. No.: 17/147,955

(22) Filed: Jan. 13, 2021

(65) Prior Publication Data

US 2021/0376300 A1    Dec. 2, 2021

(30) Foreign Application Priority Data

May 27, 2020    (KR) .................. 10-2020-0063917

(51) Int. Cl.
| | |
|---|---|
| *H01L 51/56* | (2006.01) |
| *H01L 51/50* | (2006.01) |
| *H01L 51/52* | (2006.01) |

(52) U.S. Cl.
CPC .......... *H01L 51/56* (2013.01); *H01L 51/5004* (2013.01); *H01L 51/5072* (2013.01); *H01L 51/5092* (2013.01); *H01L 51/5225* (2013.01); *H01L 2227/323* (2013.01); *H01L 2251/552* (2013.01); *H01L 2251/558* (2013.01)

(58) Field of Classification Search
CPC ............. H01L 51/5004; H01L 51/5225; H01L 2227/323
See application file for complete search history.

(56) References Cited

U.S. PATENT DOCUMENTS

| | | | |
|---|---|---|---|
| 9,620,732 | B2 | 4/2017 | Malik et al. |
| 10,074,705 | B2 | 9/2018 | Chung et al. |
| 2018/0139855 | A1 | 5/2018 | Stay et al. |
| 2019/0148663 | A1 | 5/2019 | Lee et al. |

FOREIGN PATENT DOCUMENTS

| | | |
|---|---|---|
| KR | 10-1149427 | 5/2012 |
| KR | 10-2017-0129318 | 11/2017 |
| KR | 10-2018-0022847 | 3/2018 |
| KR | 10-2019-0055281 | 5/2019 |

*Primary Examiner* — Anthony Ho
(74) *Attorney, Agent, or Firm* — Kile Park Reed & Houtteman PLLC

(57) ABSTRACT

A display device may include a pixel area and a transmission area adjacent to the pixel area, a circuit element disposed in the pixel area and including a transistor and a capacitor, a pixel electrode layer disposed in the pixel area and electrically connected to the circuit element, an emission layer disposed on the pixel electrode layer, an opposite electrode layer disposed on the emission layer, and a surface energy control layer disposed between the emission layer and the opposite electrode layer and including a perfluorinated material. The surface energy control layer may have a portion extending into the transmission area.

23 Claims, 20 Drawing Sheets

DISPLAY DEVICE AND ELECTRONIC APPARATUS INCLUDING THE SAME

CROSS-REFERENCE TO RELATED APPLICATION(S)

This application claims priority to and benefits of Korean Patent Application No. 10-2020-0063917 under 35 U.S.C. § 119, filed on May 27, 2020 in the Korean Intellectual Property Office, the entire contents of which are incorporated herein by reference.

BACKGROUND

1. Technical Field

Embodiments relate to a display device, a manufacturing method thereof, and an electronic apparatus including the same.

2. Description of the Related Art

As display devices for displaying images, light-emitting diode display devices have self-emission characteristics unlike liquid crystal display devices. Therefore, because separate light sources are not required, thicknesses and weights of the light-emitting diode display devices may be reduced. Organic light-emitting diode display devices may exhibit high quality characteristics such as low power consumption, high luminance, and high reaction speed.

The aforementioned light-emitting diode display devices may be used in electronic apparatuses of various uses and various shapes, and accordingly, light-emitting display devices of various shapes are designed.

SUMMARY

Embodiments provide a display device capable of implementing an image and/or transmitting an external image on the back side of the display device, and an electronic apparatus including the same.

Additional aspects will be set forth in part in the description which follows and, in part, will be apparent from the description, or may be learned by practice of the embodiments.

According to embodiments, a display device may include a pixel area and a transmission area adjacent to the pixel area, a circuit element disposed in the pixel area and including a transistor and a capacitor, a pixel electrode layer disposed in the pixel area and electrically connected to the circuit element, an emission layer disposed on the pixel electrode layer, an opposite electrode layer disposed on the emission layer, and a surface energy control layer disposed between the emission layer and the opposite electrode layer and including a perfluorinated material. The surface energy control layer may have a portion extending into the transmission area.

The opposite electrode layer may not overlap the transmission area.

The display device may further include an aggregate particle disposed on the surface energy control layer and the aggregate particle may include a metal element.

The opposite electrode layer may include silver (Ag), magnesium (Mg), aluminum (Al), nickel (Ni), chromium (Cr), lithium (Li), calcium (Ca), or an alloy thereof.

The display device may further include an electron transport layer disposed between the surface energy control layer and the opposite electrode, wherein the electron transport layer may include an opening corresponding to the transmission area.

The display device may further include an electron injection layer disposed between the surface energy control layer and the opposite electrode, and the electron injection layer may include a metal.

The electron injection layer may not overlap the transmission area.

The metal of the electron injection layer may include an alkali metal, an alkaline earth metal, or a lanthanide metal.

A thickness of the surface energy control layer may be less than a thickness of the emission layer.

A surface energy of the surface energy control layer may be less than or equal to about 20 mJ/m$^2$.

According to embodiments, an electronic apparatus may include a display device, wherein the display device may include a pixel area in which pixels are disposed and a transmission area adjacent to the pixel area, a pixel electrode layer disposed in the pixel area, an opposite electrode layer overlapping the pixel electrode layer in the pixel area and including a metal, an emission layer disposed between the pixel electrode layer and the opposite electrode layer, a surface energy control layer disposed between the emission layer and the opposite electrode layer, a portion of the surface energy control layer extending into the transmission area, and a first sub-functional layer disposed between the surface energy control layer and the opposite electrode layer, and including an organic material. The first sub-functional layer may include an opening corresponding to the transmission area.

A surface energy of the surface energy control layer may be less than or equal to about 20 mJ/m$^2$.

The surface energy control layer may include a perfluorinated material.

The opposite electrode layer may include silver (Ag), magnesium (Mg), aluminum (Al), nickel (Ni), chromium (Cr), lithium (Li), calcium (Ca), or an alloy thereof.

The opposite electrode layer may not overlap the transmission area.

The electronic apparatus may further include an electron injection layer disposed between the surface energy control layer and the opposite electrode, wherein the electron injection layer may include a metal.

The electronic apparatus may further include an aggregate particle disposed on the surface energy control layer, wherein the aggregate particle may include a metal element.

The metal element of the aggregate particle may include a metal element included in the opposite electrode layer or a metal element included in the electron injection layer.

The metal of the electron injection layer may include an alkali metal, an alkaline earth metal, or a lanthanide metal.

A thickness of the surface energy control layer may be less than a thickness of the emission layer.

The electronic apparatus may further include a component overlapping the transmission area.

The component may include a sensor or a camera.

The electronic apparatus may include a head-up display electronic apparatus, a mobile phone, or a display electronic apparatus for vehicles.

The above and other aspects, features, and advantages of the embodiments of the disclosure will be more apparent from the following description, the accompanying drawings, and claims.

BRIEF DESCRIPTION OF THE DRAWINGS

The above and other aspects, features, and advantages of the embodiments of the disclosure will be more apparent from the following description taken in conjunction with the accompanying drawings, in which.

DETAILED DESCRIPTION OF THE EMBODIMENTS

Figure 1:
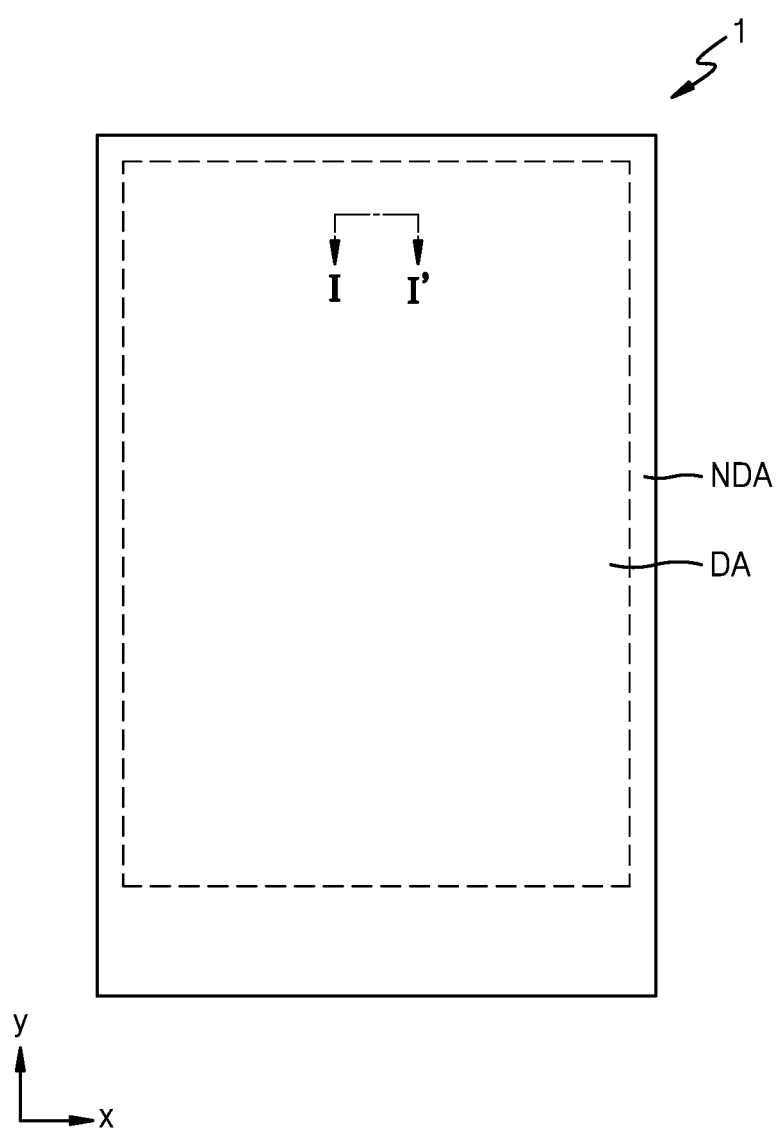
FIG. 1 is a schematic plan view of a display device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Various modifications may be applied to the embodiments, and particular embodiments will be illustrated in the drawings and described in the detailed description. The effects and features of the disclosure, and a method to achieve the same will become more apparent from the following embodiments that are described in detail in conjunction with the accompanying drawings. However, the disclosure is not limited to the following embodiments and may be embodied in various forms.

The following embodiments will now be described more fully with reference to the accompanying drawings. When describing embodiments with reference to the accompanying drawings, the same or corresponding elements are denoted by the same reference numerals and a redundant description thereof will be omitted.

It will be understood that although the terms "first," "second," etc. may be used herein to describe various elements, these elements should not be limited by these terms. These elements are only used to distinguish one element from another.

As used herein, the singular forms "a," "an," and "the" are intended to include the plural forms as well, unless the context clearly indicates otherwise.

It will be understood that the terms "comprises," "comprising," "includes," "including," "have," "having," "contains," and/or "containing" used herein specify the presence of stated features or elements, but do not preclude the presence or addition of one or more other features or elements.

It will be understood that when a layer, region, or element is referred to as being "formed on," another layer, region, or element, it can be directly or indirectly formed on the other layer, region, or element. For example, intervening layers, regions, or elements may be present.

Sizes of elements in the drawings may be exaggerated for convenience of description. In other words, because the sizes and thicknesses of elements in the drawings are arbitrarily illustrated for convenience of description, the following embodiments are not limited thereto.

When a certain embodiment may be implemented differently, a specific process order may be performed differently from the described order. For example, two consecutively described processes may be performed substantially at the same time or performed in an order opposite to the described order.

In the embodiments, when a layer, region, or element is referred to as being connected to another layer, region, or element, it can be directly connected to the other layer, region, or element or indirectly connected to the other layer, region, or element via intervening layers, regions, or elements. For example, in the specification, when a layer, region, or element is referred to as being electrically connected to another layer, region, or element, it can be directly electrically connected to the other layer, region, or element or indirectly electrically connected to the other layer, region, or element via intervening layers, regions, or elements. Other expressions that explain the relationship between elements, such as "between," "directly between," "adjacent to," or "directly adjacent to," should be construed in the same way.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±20%, 10%, or 5% of the stated value.

Unless otherwise defined, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Figure 2:
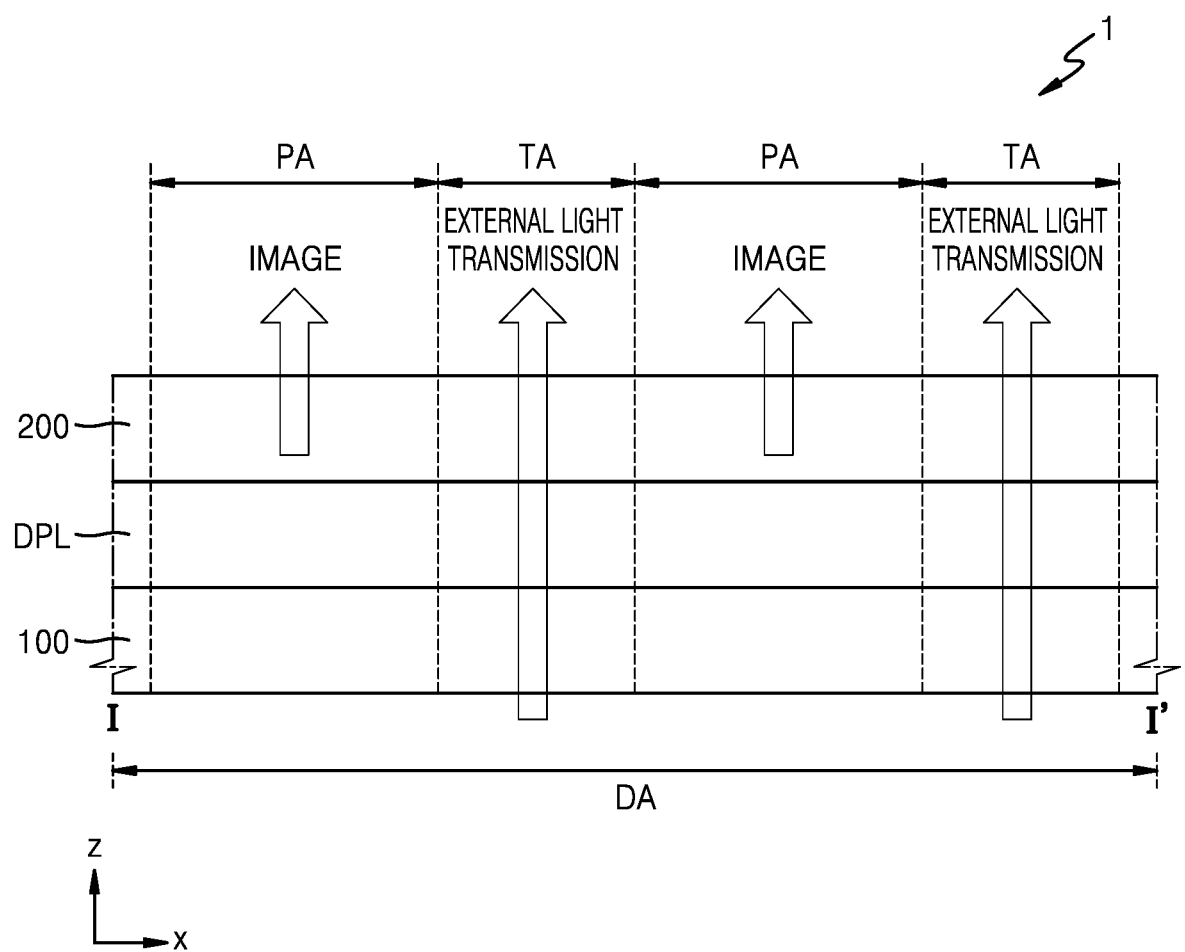
FIG. 2 is a schematic cross-sectional view of a display device according to an embodiment, corresponding to a cross-section taken along a line I-I' of FIG. 1.

FIG. 1 is a schematic plan view of a display device 1 according to an embodiment, and FIG. 2 is a schematic cross-sectional view of a display device 1 according to an embodiment, corresponding to a cross-section taken along a line I-I' of FIG. 1.

As shown in FIG. 1, the display device 1 may include a display area DA and a non-display area NDA adjacent to the display area DA.

An image may be displayed on the display area DA. The display area DA may include pixels, and each pixel may include a light-emitting element, for example, a light-emitting diode. Each light-emitting element may be electrically connected to a circuit element including a transistor and a capacitor, and the circuit element may be located in the display area DA.

The non-display area NDA, which is an area in which an image is not displayed, may entirely surround the display area DA. In the non-display area NDA, a driver for providing an electrical signal or power to the circuit element and/or the light-emitting element in the display area DA may be arranged, and the non-display area NDA may include a pad that is an area to which an electronic element or a printed circuit board may be connected.

As shown in FIG. 2, the display area DA may include pixel areas PA in which pixels are arranged and transmission areas TA adjacent to the pixel area PA. The transmission area TA may be between the pixel areas PA, for example, the pixels.

The display device 1 may display an image through the pixels arranged in the pixel area PA. The display device 1 may transmit external light through the transmission area TA. External light is distinguished from light emitted from the display device 1, for example, light emitted from the pixels. For example, external light may include light outside the display device 1, for example, natural light or light generated from an electronic element (e.g., a lamp, a sensor, etc.) different from the display device 1.

Referring to FIG. 2, the display device 1 may include a substrate 100, a display layer DPL on a front surface of the substrate 100, and an encapsulation layer 200.

The substrate 100 may include glass or a polymer resin. The glass may include materials such as alkali free glass or sodalime glass. The polymer resin may include polyethersulfone (PES), polyarylate (PAR), polyetherimide (PEI), polyethylene naphthalate (PEN), polyethyelene terephthalate (PET), polyphenylene sulfide (PPS), polyimide (PI), polycarbonate, cellulose triacetate (TAC), cellulose acetate propionate (CAP), etc. In an embodiment, the substrate 100 may have a stacked structure of at least one base layer including the aforementioned polymer resin, and a barrier layer located on the at least one base layer and including an inorganic insulating layer.

The display layer DPL may include light-emitting diodes and circuit elements respectively connected to the light-emitting diodes. The circuit elements each may include a thin-film transistor and a capacitor. The light-emitting diodes and the circuit elements may be arranged in the pixel area PA and may not be arranged in the transmission area TA.

The display layer DPL may be covered by the encapsulation layer 200, and the encapsulation layer 200 may be a rigid encapsulation layer including glass or a flexible encapsulation layer including thin films. The flexible encapsulation layer may include at least one organic encapsulation layer and at least one inorganic encapsulation layer. The at least one organic encapsulation layer may include an organic insulating material, and the at least one inorganic encapsulation layer may include an inorganic insulating material.

Though FIG. 2 illustrates that the light-emitting diodes of the display layer DPL display an image in a direction from the substrate 100 toward the encapsulation layer 200, in another embodiment, light emitted from the light-emitting diodes of the display layer DPL may proceed in a direction from the encapsulation layer 200 toward the substrate 100. For example, the light emitted from the light-emitting diodes may be emitted toward a rear surface of the substrate 100.

Figure 3:
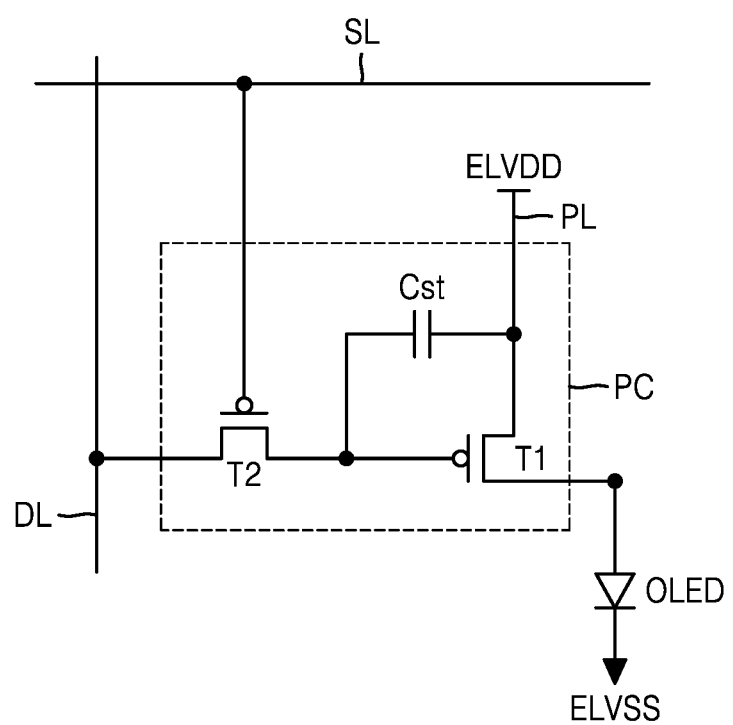
FIG. 3 is a schematic circuit diagram of a circuit element connected to a light-emitting diode of a display device according to an embodiment.

FIG. 3 is a schematic circuit diagram of a circuit element PC connected to a light-emitting diode of a display device according to an embodiment. FIG. 3 illustrates an organic light-emitting diode OLED as an embodiment of the light-emitting diode.

Referring to FIG. 3, the organic light-emitting diode OLED may be electrically connected to the circuit element PC, and the circuit element PC may include a first transistor T1 and a second transistor T2, and a storage capacitor Cst.

The second transistor T2, which is a switching transistor, may be connected to a scan line SL and a data line DL and may be configured to transmit, to the first transistor T1, a data voltage input from the data line DL according to a switching voltage input from the scan line SL. The storage capacitor Cst may be connected to the second transistor T2 and a driving voltage line PL and may be configured to store a voltage corresponding to a difference between the voltage received from the second transistor T2 and a first power voltage ELVDD supplied to the driving voltage line PL.

The first transistor T1 may be connected to the driving voltage line PL and the storage capacitor Cst and may be configured to control a driving current flowing through the organic light-emitting diode OLED from the driving voltage line PL in response to a value of the voltage stored in the storage capacitor Cst. The organic light-emitting diode OLED may emit light having a certain luminance according to the driving current. An opposite electrode (e.g., a cathode) of the organic light-emitting diode OLED may receive a second power voltage ELVSS.

Though FIG. 3 illustrates that the circuit element PC includes two transistors and one storage capacitor, in another embodiment, the number of transistors and/or the number of capacitors may be variously changed.

Figure 9:
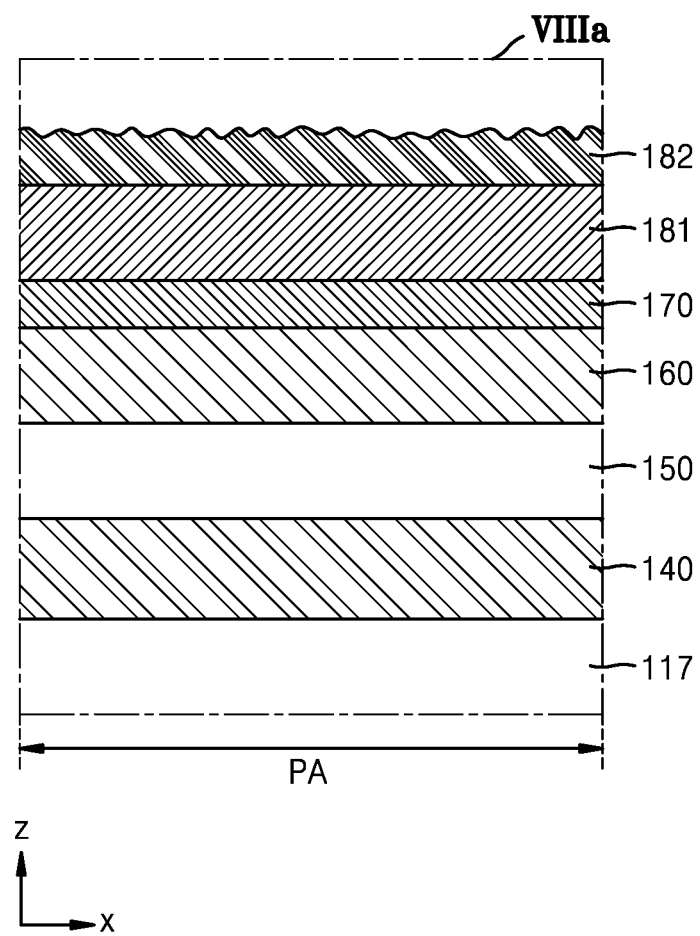
FIG. 9 is an enlarged schematic cross-sectional view of a region VIIIa of FIG. 8.
Figure 10A:
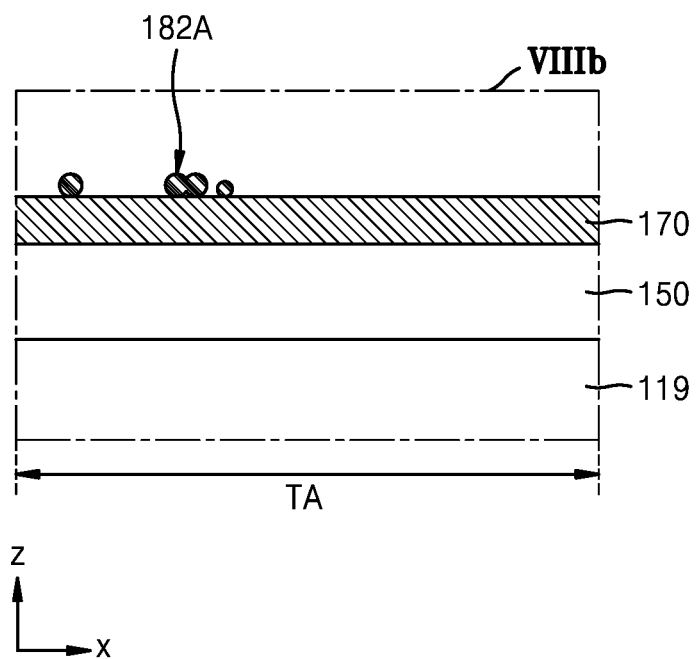
FIGS. 10A and 10B are enlarged schematic cross-sectional views of a region VIIIb of FIG. 8.
Figure 10B:
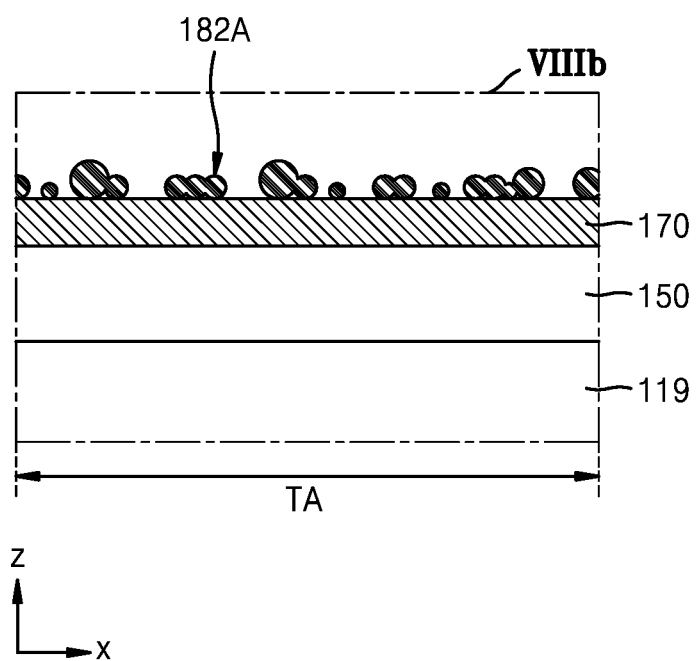
Figure 12:
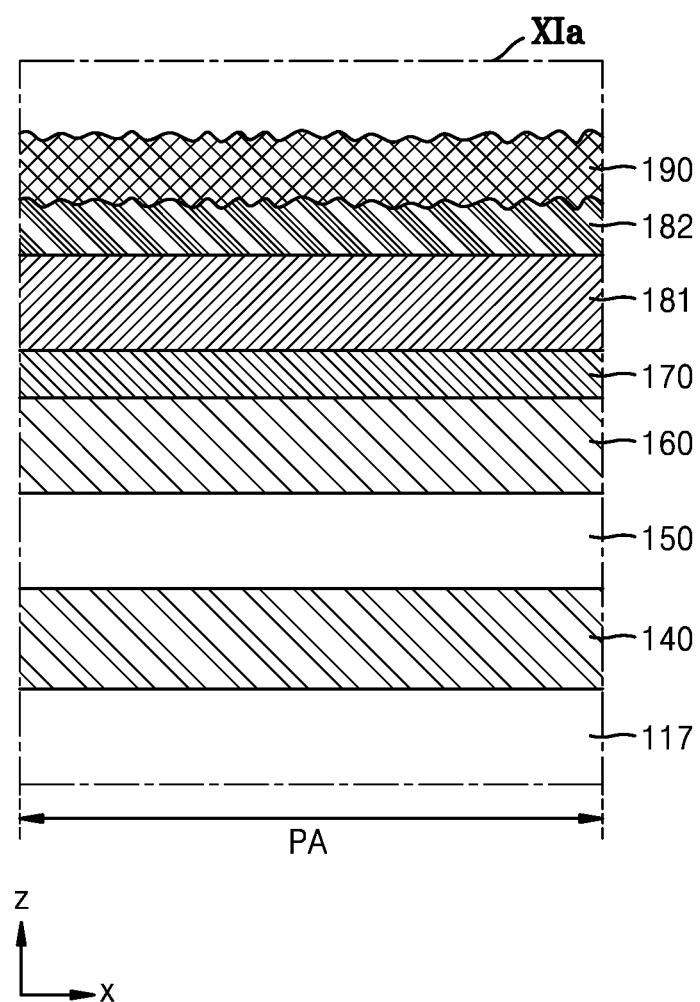
FIG. 12 is an enlarged schematic cross-sectional view of a region XIa of FIG. 11.
Figure 13A:
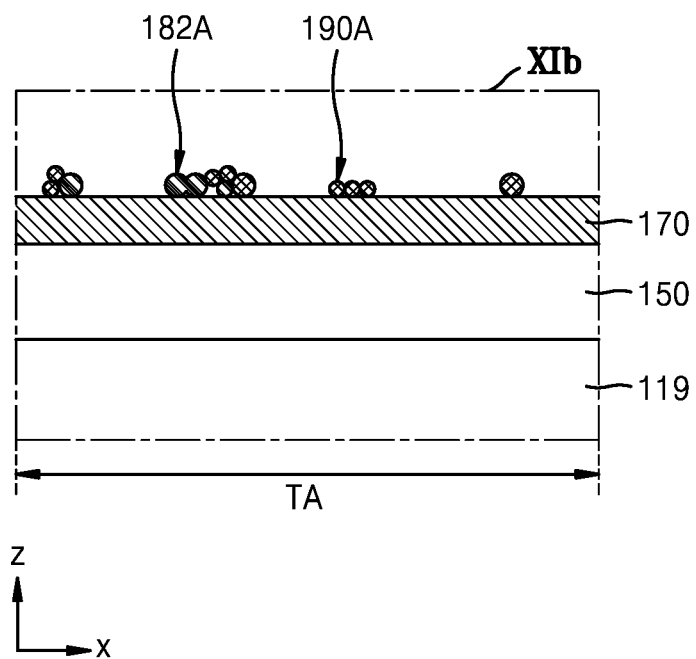
FIGS. 13A and 13B are enlarged schematic cross-sectional views of a region XIb of FIG. 11.
Figure 13B:
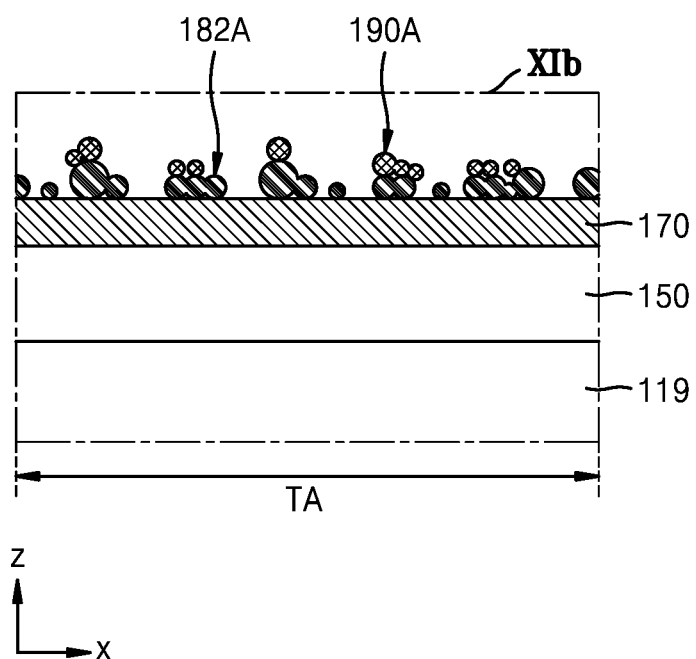

FIGS. 4, 5, 6, 7, 8, and 11 are schematic cross-sectional views of a display device according to a manufacturing process of the display device, according to embodiments. FIG. 9 is an enlarged schematic cross-sectional view of a region VIIIa of FIG. 8. FIGS. 10A and 10B are enlarged schematic cross-sectional views of a region VIIIb of FIG. 8. FIG. 12 is an enlarged schematic cross-sectional view of a region XIa of FIG. 11. FIGS. 13A and 13B are enlarged schematic cross-sectional views of a region XIb of FIG. 11.

Figure 4:
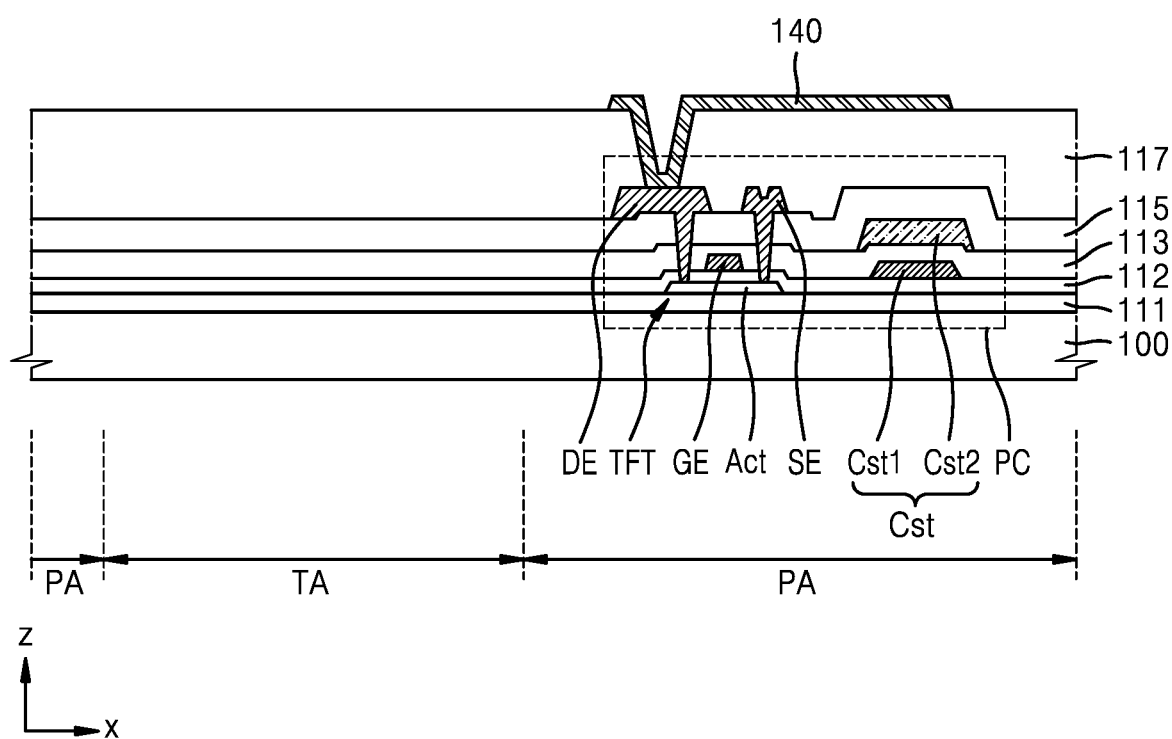
FIG. 4 is a schematic cross-sectional view according to a manufacturing process of the display device, according to an embodiment.

Referring to FIG. 4, a pixel electrode layer 140 is formed on the substrate 100. As described above, the substrate 100 may include glass or a polymer resin. Before the pixel electrode layer 140 is formed, various layers including a circuit element PC may be formed. FIG. 4 illustrates that a circuit element PC including a thin-film transistor TFT and a storage capacitor Cst is formed on the substrate 100, and the circuit element PC is located in the pixel area PA instead of the transmission area TA.

A buffer layer 111 may be formed on a front surface of the substrate 100. The buffer layer 111 may prevent impurities from penetrating into a semiconductor layer Act of the thin-film transistor TFT. The buffer layer 111 may include an inorganic insulating material such as silicon oxide, silicon oxynitride, and/or silicon nitride, and may have a single-layered or multi-layered structure including the aforementioned material.

The thin-film transistor TFT and the storage capacitor Cst may be formed on the buffer layer 111. The thin-film transistor TFT may include a semiconductor layer Act, a gate electrode GE overlapping a channel region of the semiconductor layer Act, and a source electrode SE and a drain electrode DE respectively connected to a source region and a drain region of the semiconductor layer Act. A gate insulating layer 112 may be disposed between the semiconductor layer Act and the gate electrode GE, and a first interlayer insulating layer 113 and a second interlayer insulating layer 115 may be disposed between the gate electrode GE and the source electrode SE or between the gate electrode GE and the drain electrode DE.

The storage capacitor Cst may include a first capacitor plate Cst1 and a second capacitor plate Cst2, which overlap each other. The first interlayer insulating layer 113 may be disposed between the first capacitor plate Cst1 and the second capacitor plate Cst2.

The semiconductor layer Act may include polysilicon. In some embodiments, the semiconductor layer Act may include amorphous silicon. In some embodiments, the semiconductor layer Act may include an oxide of at least one material selected from the group of indium (In), gallium (Ga), tin (Sn), zirconium (Zr), vanadium (V), hafnium (Hf), cadmium (Cd), germanium (Ge), chromium (Cr), titanium (Ti), and zinc (Zn).

The gate insulating layer 112 may include an inorganic insulating material such as silicon oxide, silicon oxynitride, or silicon nitride, and may have a single-layered or multi-layered structure including the aforementioned material.

The gate electrode GE and/or the first capacitor plate Cst1 may include a low-resistance conductive material such as molybdenum (Mo), aluminum (Al), copper (Cu), and/or titanium (Ti), and may have a single-layered or multi-layered structure including the aforementioned material.

The first interlayer insulating layer 113 may include an inorganic insulating material such as silicon oxide, silicon oxynitride, and silicon nitride and may have a single-layered or multi-layered structure including the aforementioned material.

The second capacitor plate Cst2 may include Al, platinum (Pt), palladium (Pd), silver (Ag), magnesium (Mg), gold (Au), nickel (Ni), neodymium (Nd), iridium (Ir), Cr, nickel (Ni), calcium (Ca), Mo, Ti, tungsten (W), and/or Cu, and may have a single-layered or multi-layered structure including the aforementioned material.

The second interlayer insulating layer 115 may include an inorganic insulating material such as silicon oxide, silicon oxynitride, and silicon nitride and may have a single-layered or multi-layered structure including the aforementioned material.

The source electrode SE or the drain electrode DE may include Al, Pt, Pd, Ag, Mg, Au, Ni, Nd, Ir, Cr, Ni, Ca, Mo, Ti, W, and/or Cu, and may have a single-layered or multi-layered structure including the aforementioned material. For example, the source electrode SE or the drain electrode DE may have a three-layered structure of a titanium layer/aluminum layer/titanium layer.

A planarization insulating layer 117 may include a different material from at least one inorganic insulating layer arranged thereunder, for example, the gate insulating layer 112, the first interlayer insulating layer 113, and the second interlayer insulating layer 115. For example, the planarization insulating layer 117 may include an organic insulating material such as acryl, benzocyclobutene (BCB), polyimide, or hexamethyldisiloxane (HMDSO).

The pixel electrode layer 140 may be formed on the planarization insulating layer 117. The pixel electrode layer 140 may be electrically connected to the thin-film transistor TFT through a contact hole formed in the planarization insulating layer 117.

The pixel electrode layer 140 may include a reflective electrode. For example, the pixel electrode layer 140 may include a reflection layer including Ag, Mg, Al, Pt, Pd, Au, Ni, Nd, Ir, Cr, or a compound thereof. The pixel electrode layer 140 may include a reflection layer including the aforementioned material, and a transparent conductive layer arranged above and/or under the reflection layer. The transparent conductive layer may include indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode layer 140 may have a three-layered structure of an ITO layer/Ag layer/ITO layer.

The pixel electrode layer 140 may be patterned by etching (e.g., wet etching or dry etching) after a layer including the aforementioned materials is formed. The pixel electrode layer 140 is formed in the pixel area PA and is not formed in the transmission area TA.

Figure 5:
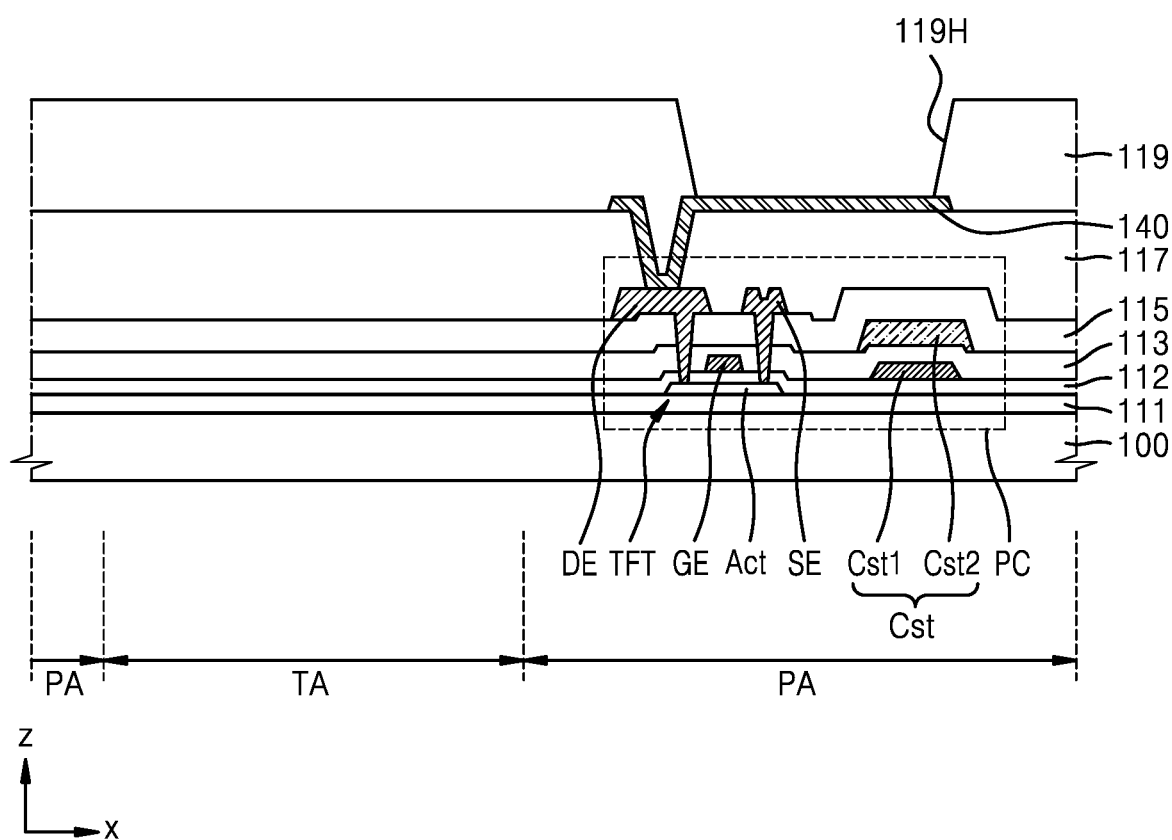
FIG. 5 is a schematic cross-sectional view according to a manufacturing process of the display device, according to an embodiment.

Referring to FIG. 5, an upper insulating layer 119 may be formed on the pixel electrode layer 140. In an embodiment, the upper insulating layer 119 may be formed through an exposure and development process using photoresist.

The upper insulating layer 119 may include a through hole 119H that covers an edge of the pixel electrode layer 140 and exposes an upper surface of the pixel electrode layer 140. The through hole 119H of the upper insulating layer 119 may define an emission area of the light-emitting diode, which is formed through a process to be described later.

The upper insulating layer 119 may include an organic insulating material such as BCB, polyimide, or HMDSO.

Figure 6:
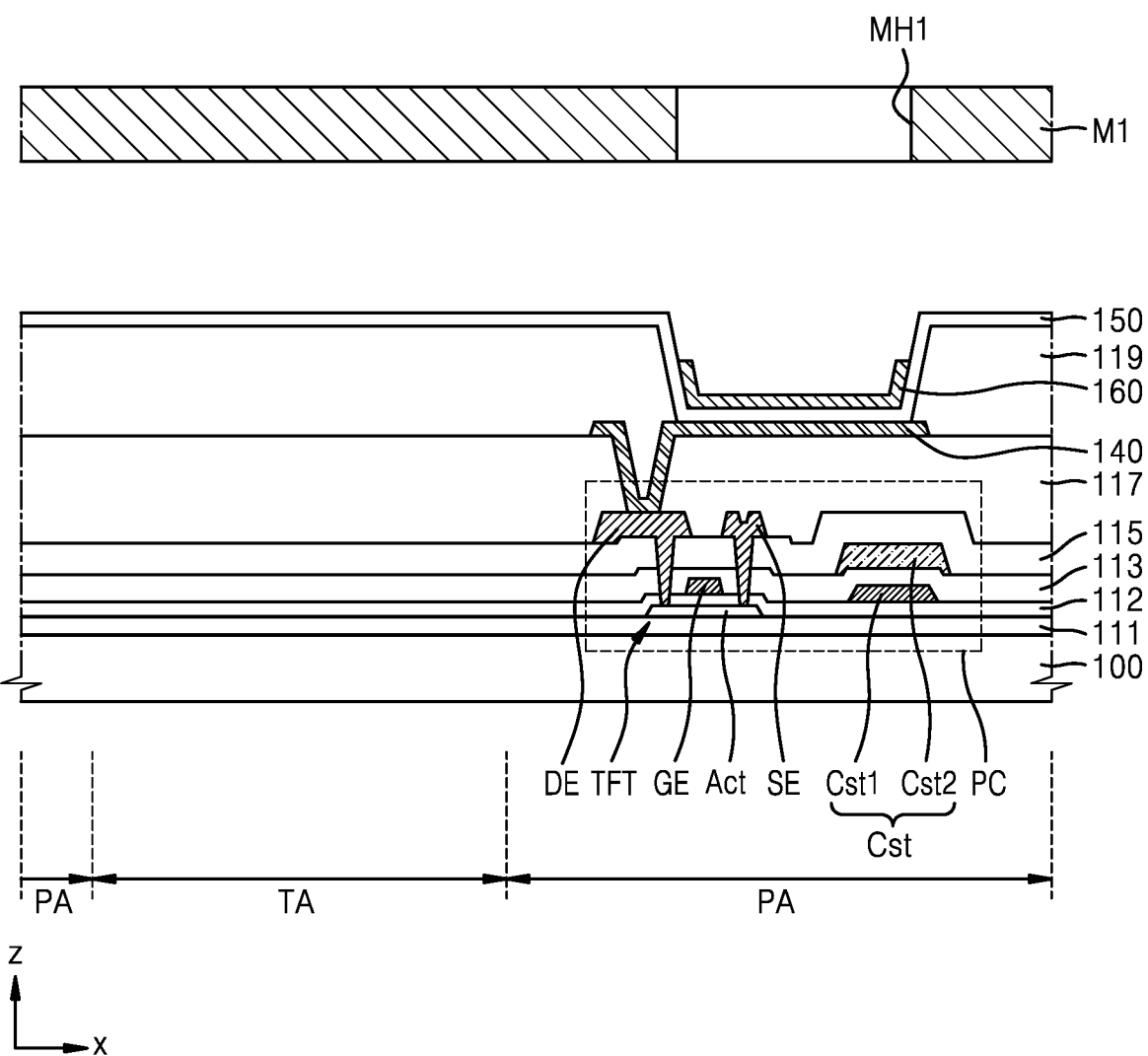
FIG. 6 is a schematic cross-sectional view according to a manufacturing process of the display device, according to an embodiment.

Referring to FIG. 6, an emission layer 160 may be formed on the pixel electrode layer 140. The emission layer 160 may be formed by a deposition method (e.g., a vacuum deposition method) using a first mask M1 including a first mask hole MH1 that overlaps the pixel electrode layer 140. In some embodiments, the emission layer 160 may be formed using various methods such as spin coating, casting, Langmuir-Blodgett (LB), inkjet printing, laser printing, laser thermal transfer, etc.

The emission layer 160 may include an organic material, for example, a polymer organic material or a low molecular weight organic material. The emission layer 160 may include a material emitting a certain color (e.g., red, green, and blue) and may include a fluorescent material or a phosphorescent material. The emission layer 160 may include a host material and a dopant material.

Before the emission layer 160 is formed, a first functional layer 150 may be formed on the pixel electrode layer 140. The first functional layer 150 may be formed in the display area DA (see FIG. 1) using an open mask including a mask hole having a size corresponding to the display area DA (see FIG. 1). In this regard, FIG. 6 illustrates that the first functional layer 150 is located in the transmission area TA and the pixel area PA. For example, the first functional layer 150 may continuously cover the transmission area TA and the pixel area PA.

The first functional layer 150 may include a hole transport layer (HTL) and/or a hole injection layer (HIL). A general hole injection material and/or hole transport material which lowers a hole injection barrier and has a large hole mobility may be used for the first functional layer 150, and the hole injection material and/or the hole transport material may be an organic material.

The HTL may include a phthalocyanine compound, N,N'-diphenyl-N,N'-bis-[4-(phenyl-mtolyl-amino)-phenyl]-biphenyl-4,4'-diamine (DNTPD), 4,4',4"-tris(3-methylphenylphenylamino) triphenylamine (m-MTDATA), 4,4'4"-Tris (N,N-diphenylamino)triphenylamine (TDATA), 4,4',4"-tris{N,-(2naphthyl)-N-phenylamino}-triphenylamine (2TNATA), poly(3,4-ethylenedioxythiophene)/poly(4styrenesulfonate) (PEDOT/PSS), polyaniline/dodecylbenzenesulfonic acid (PANI/DBSA), polyaniline/camphor sulfonic acid (PANI/CSA), polyaniline)/poly(4-styrenesulfonate) (PANI/PSS), etc.

The HIL may include carbazole derivatives, fluorine derivatives, triphenylamine derivatives such as N,N'-bis(3-methylphenyl)-N,N'-diphenyl-[1,1biphenyl]-4,4'-diamine (TPD), and/4,4',4"-tris(N-carbazolyl)triphenylamine (TCTA), N,N'-di(1-naphthyl)-N,N'-diphenylbenzidine (NPB), 4,4'-Cyclohexylidene bis[N,N-bis(4-methylphenyl) benzenamine (TAPC), etc.

Figure 7:
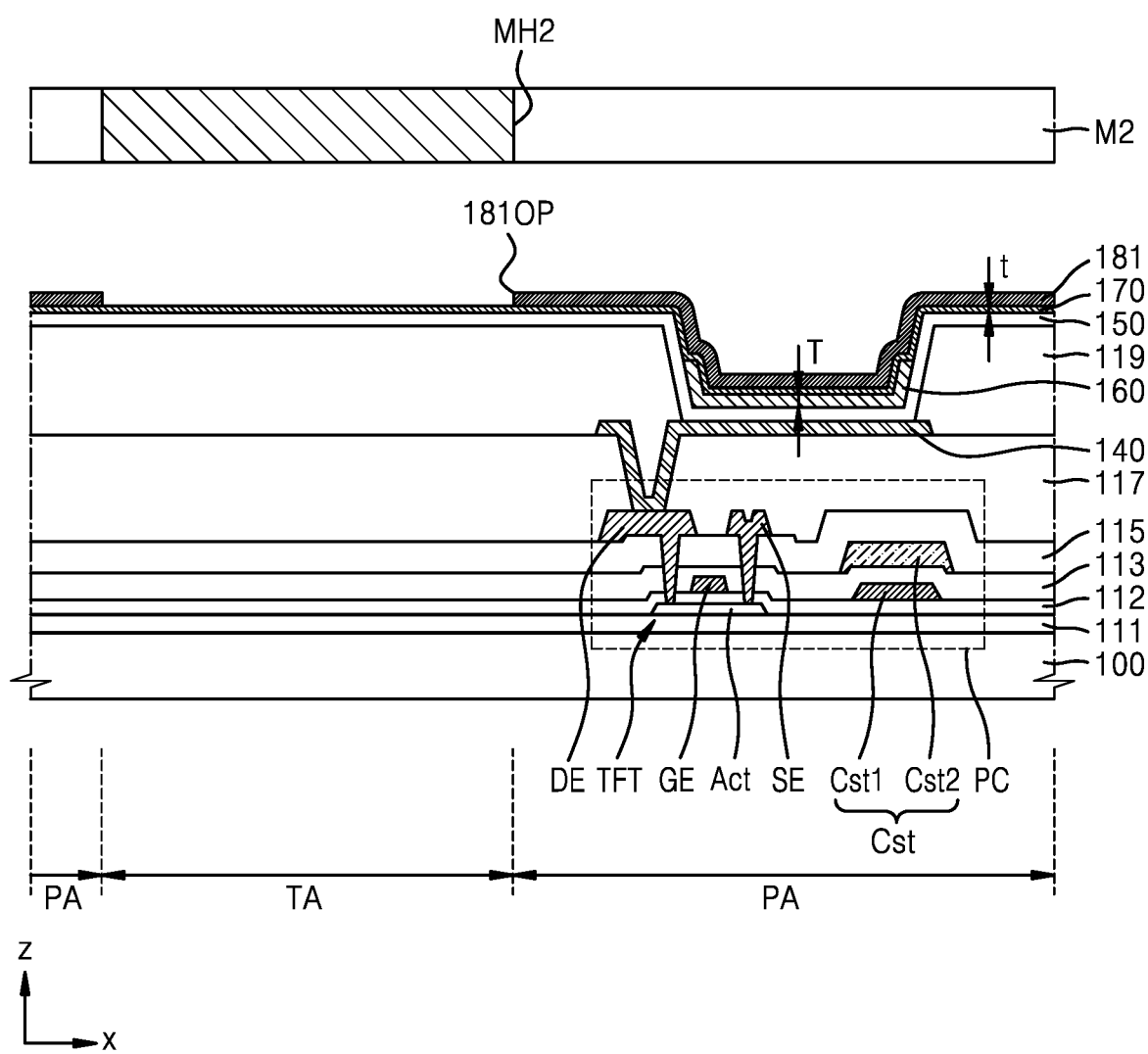
FIG. 7 is a schematic cross-sectional view according to a manufacturing process of the display device, according to an embodiment.

Referring to FIG. 7, a surface energy control layer 170 may be formed on the emission layer 160. The surface energy control layer 170 may be formed in the display area DA (see FIG. 1) using an open mask including a mask hole having a size corresponding to the display area DA (see FIG. 1), and thus may be in the pixel area PA and transmission area TA. For example, the surface energy control layer 170 may continuously cover the pixel area PA and transmission area TA.

In an embodiment, the surface energy control layer 170 may be formed directly on the emission layer 160. In the pixel area PA, the surface energy control layer 170 may directly contact an upper surface of the emission layer 160. In the transmission area TA, the surface energy control layer 170 may directly contact an upper surface of the first functional layer 150.

The surface energy control layer 170 may have a surface energy of less than or equal to about 20 mJ/m$^2$. The surface energy control layer 170 may include a perfluorinated material. For example, the surface energy control layer 170 may include a material having a —CF$_3$ functional group in which three fluorine atoms are bonded to a carbon atom, or a material having a CF$_2$— functional group. In some embodiments, when the surface energy control layer 170 includes the —CF$_3$ functional group in which three fluorine atoms are bonded to a carbon atom, the surface energy may be about 6 mJ/m$^2$, and when the surface energy control layer 170 includes the CF$_2$— functional group, the surface energy may be about 18 mJ/m$^2$.

Because the surface energy control layer 170 is between the emission layer 160 and an opposite electrode layer 190 (see FIG. 11) to be described later, an electron mobility of the surface energy control layer 170 may be greater than or equal to about $1 \times 10^{-7}$ cm$^2$/V·s.

A thickness t of the surface energy control layer 170 may be less than a thickness T of the emission layer 160. For example, the thickness t of the surface energy control layer 170 may be about 0.1 times or less than the thickness T of the emission layer 160. In an embodiment, the thickness t of the surface energy control layer 170 may be about 100 Å, and the thickness T of the emission layer 160 may be about 1450 Å.

A second functional layer 180 (see FIG. 8) including a first sub-functional layer 181 and a second sub-functional layer 182 may be formed on the surface energy control layer 170. Before the second sub-functional layer 182 is formed, the first sub-functional layer 181 may be formed directly on the surface energy control layer 170.

The surface energy control layer 170 is for preventing or suppressing the formation of the second sub-functional layer 182 and/or the opposite electrode layer 190 (see FIG. 11) in a process to be described later. When the first sub-functional layer 181 is not disposed in the pixel area PA, the opposite electrode layer 190 (see FIG. 11) may not be formed in the pixel area PA, and thus, the light-emitting diode is not formed in the pixel area PA. The first sub-functional layer 181 may function as an intermediate layer for forming the second sub-functional layer 182 and/or the opposite electrode layer 190 (see FIG. 11).

The first sub-functional layer 181 may be disposed using a second mask M2 including a second mask hole MH2 that overlaps the pixel area PA. In some embodiments, the first sub-functional layer 181 may be formed using various methods such as spin coating, casting, LB, inkjet printing, laser printing, laser thermal transfer, etc.

The first sub-functional layer 181 may include an opening 181OP corresponding to the transmission area TA, and a portion of the surface energy control layer 170, for example, a portion of the surface energy control layer 170 corresponding to the transmission area TA, may be exposed through the opening 181OP.

The first sub-functional layer 181 may include an electron transport layer (ETL), and the ETL may include an organic material. For example, the first sub-functional layer 181 may include Tris(8-hydroxyquinolinato)aluminum (Alq$_3$), 1,3,5-Tri(1-phenyl-1H-benzo[d]imidazol-2-yl)phenyl (TPBi), 2,9-Dimethyl-4,7-diphenyl-1,10-phenanthroline (BCP), 4,7-Diphenyl-1,10-phenanthroline (Bphen), 3-(4-Biphenylyl)-4-phenyl-5-tert-butylphenyl-1,2,4-triazole (TAZ), 4(Naphthalen-1-yl)-3,5-diphenyl-4H-1,2,4-triazole (NTAZ), 2-(4-Biphenylyl)-5-(4-tert-butylphenyl)1,3,4-oxadiazole (tBu-PBD), Bis(2-methyl-8-quinolinolato-N1,O8)-(1,1'-Biphenyl-4-olato)aluminum (BAlq), berylliumbis (benzoquinolin-10-olate) (Bebq2), and/or 9,10-di (naphthalene-2-yl)anthracene (ADN).

The first sub-functional layer 181 may include a layer that improves a service life of the light-emitting diode. For example, the first sub-functional layer 181 may include the layer having a triplet energy that satisfies 2.3 eV or greater, and/or a value of EHOMO-ELUMO may be greater than 3.0 eV (e.g., EHOMO-ELUMO>3.0 eV). In some embodiments, the layer of the first sub-functional layer 181 may include a bipolar compound having an electron withdrawing group (EWG) having a large electron absorbability and an electron donating group (EDG) having a large electron donating ability.

Figure 8:
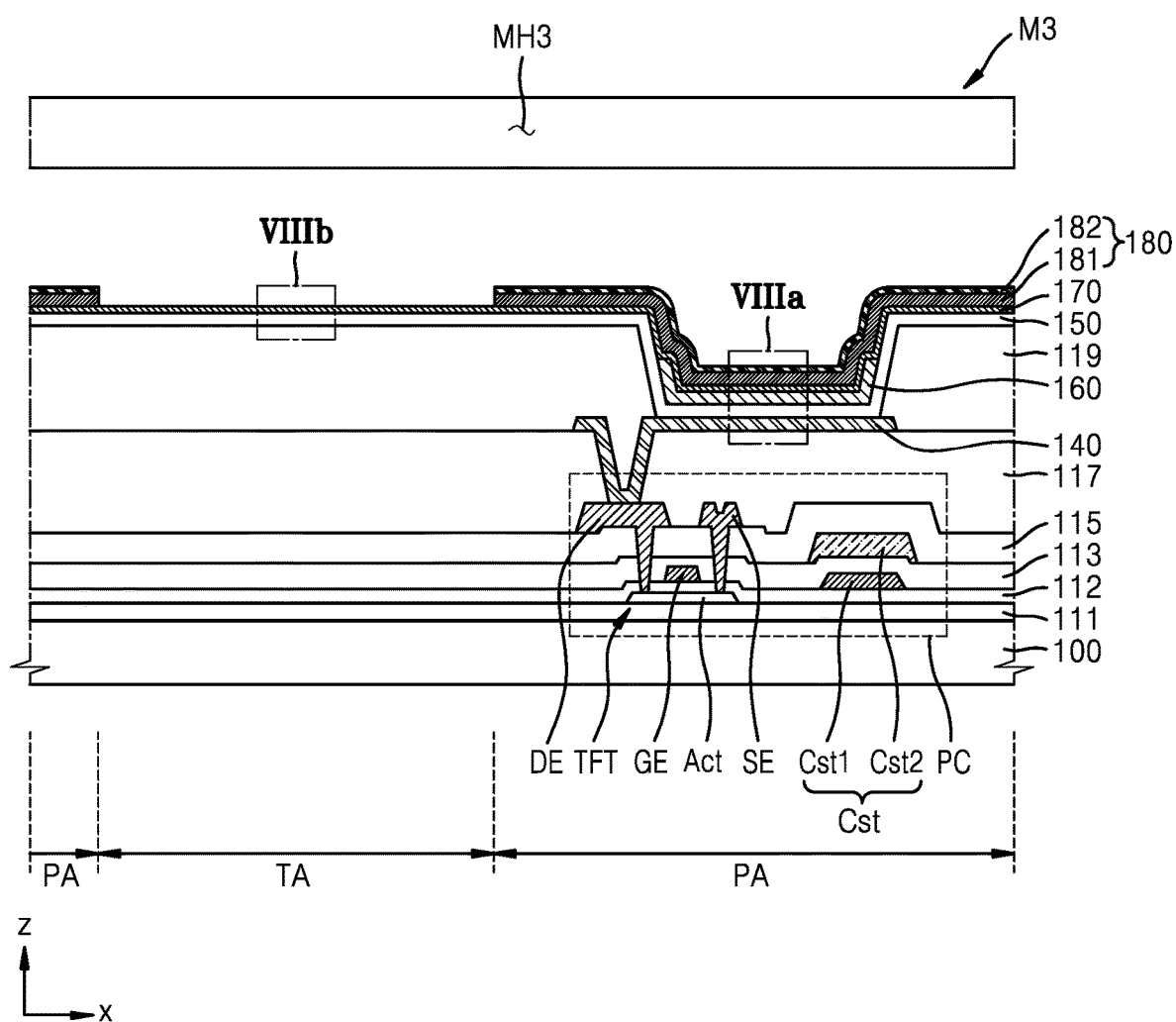
FIG. 8 is a schematic cross-sectional view according to a manufacturing process of the display device, according to an embodiment.

Referring to FIG. 8, the second sub-functional layer 182 may be formed on the first sub-functional layer 181. The second sub-functional layer 182 may include an electron injection layer (EIL). The EIL may include a metal such as an alkali metal, an alkaline earth metal, and/or a lanthanide metal. In some embodiments, the second sub-functional layer 182 may include lithium fluoride (LiF), lithium quinolate (LiQ), lithium oxide (Li2O), barium oxide (BaO), sodium chloride (NaCl), cesium fluoride (CsF), a lanthanide metal (such as Yb), and/or a metal halide (such as rubidium chloride (RbCl), or rubidium iodide (RbI)).

The second sub-functional layer 182 may be formed (e.g., deposited) using a third mask M3 including a third mask hole MH3 corresponding to the display area DA (see FIG. 1), for example, an open mask. As shown in FIG. 8, the third mask hole MH3 may overlap the transmission area TA and the pixel area PA. A material constituting the second sub-functional layer 182 may move onto the substrate 100 through the third mask hole MH3. A material disposed in the pixel area PA among materials that passed through the third mask hole MH3 may be deposited on the first sub-functional layer 181 to form the second sub-functional layer 182. A material disposed in the transmission area TA among the materials that passed through the third mask hole MH3 may not form a layer due to a difference in surface energy from the surface energy control layer 170 exposed through the opening 181OP of the first sub-functional layer 181. As shown in FIG. 8, the second sub-functional layer 182 may be formed only in the pixel area PA without overlapping the transmission area TA.

Referring to FIG. 9, the second sub-functional layer 182 may be formed with a thickness in the pixel area PA. The layer may have a structure of continuously formed in widthwise and/or lengthwise directions. In the pixel area PA, the second sub-functional layer 182 may be continuously formed in the widthwise direction (e.g., an x direction) as shown in FIG. 9. Therefore, a continuous interface may be formed in the widthwise direction between the second sub-functional layer 182 and a layer adjacent to the second sub-functional layer 182. For example, an interface between the second sub-functional layer 182 and the first sub-functional layer 181 in the pixel area PA may be continuously formed in the widthwise direction.

As shown in FIG. 10A, the material constituting the second sub-functional layer 182 (see FIG. 8) is substantially not in the transmission area TA by the surface energy control layer 170, or as shown in FIG. 10B, only a small amount of the material constituting the second sub-functional layer 182 is located in the transmission area TA, and a layer corresponding to the second sub-functional layer 182 (see FIG. 8) is not formed in the transmission area TA. Ideally, the same material as the material constituting the second sub-functional layer 182 (see FIG. 8) may not be in the transmission area TA. However, because the second sub-functional layer 182 (see FIG. 8) is formed through the open mask, as shown in FIGS. 10A and 10B, a small amount or a very small amount of aggregates 182A may be in the transmission area TA. The aggregates 182A are particles (aggregate particles) and may have different shapes and/or diameters. The aggregates 182A may include the same material as the second sub-functional layer 182 (see FIG. 8). The aggregates 182A are discontinuously and/or randomly arranged in the widthwise direction, and thus, a portion of the surface energy control layer 170 corresponding to the transmission area TA may be exposed through spaces between the aggregates 182A.

Figure 11:
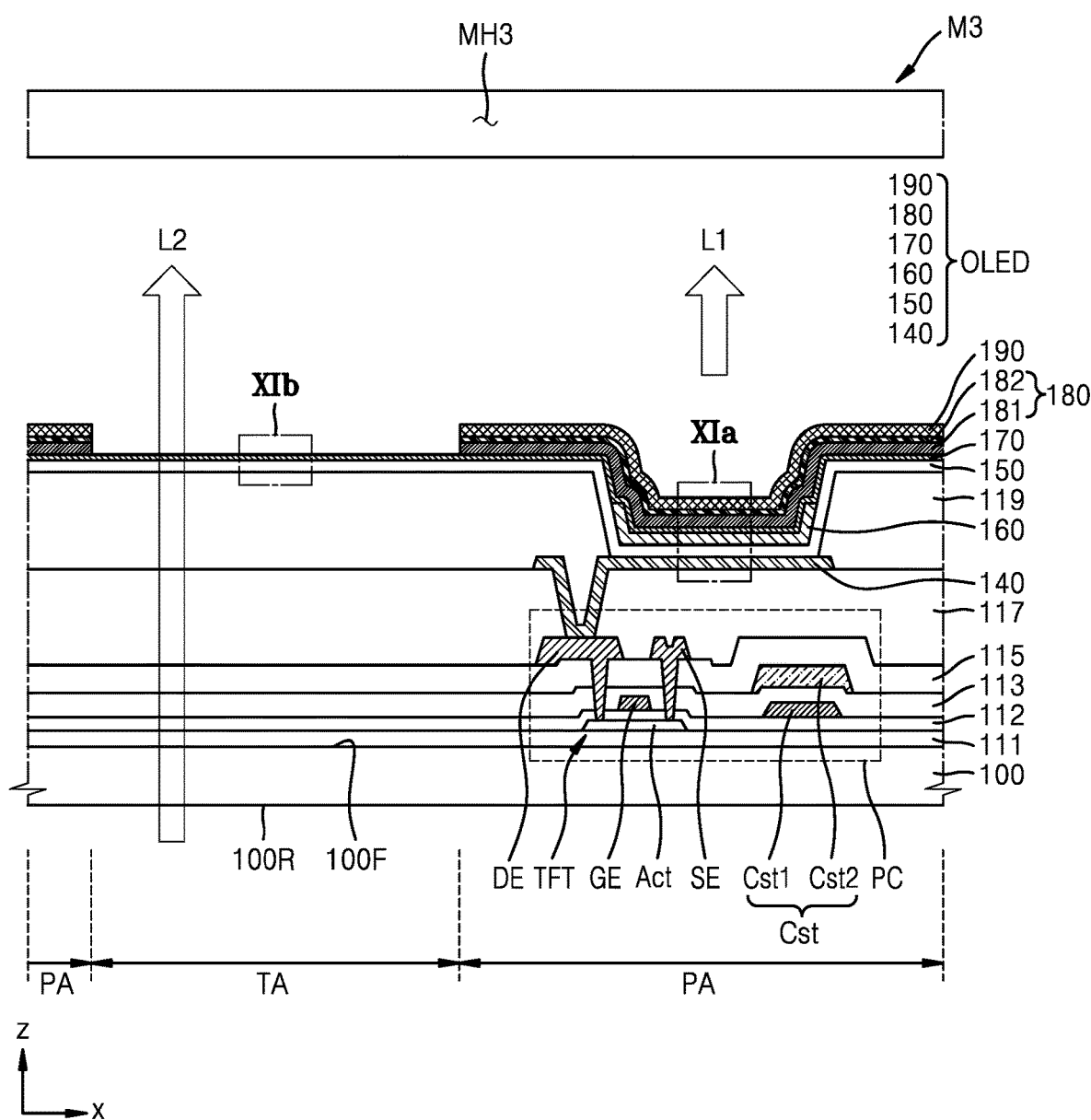
FIG. 11 is a schematic cross-sectional view according to a manufacturing process of the display device, according to an embodiment.

Referring to FIG. 11, the opposite electrode layer 190 is formed on the second functional layer 180, for example, on the second sub-functional layer 182.

The opposite electrode layer 190 may include a transparent electrode, for example, a semi-transparent electrode. The opposite electrode layer 190 may include metal having a relatively low work function. For example, the opposite electrode layer 190 may include a thin film including Ag, Mg, Al, Ni, Cr, Li, Ca, or an alloy thereof. In an embodiment, the opposite electrode layer 190 may include Ag and Mg.

The opposite electrode layer 190 may be formed (e.g., deposited) in the display area DA (see FIG. 1) using the third mask M3 including the third mask hole MH3 corresponding to the display area DA (see FIG. 1), for example, the open mask. As shown in FIG. 11, a material constituting the opposite electrode layer 190 may be disposed on the substrate 100 through the third mask hole MH3. The material disposed on the pixel area PA among the materials that passed through the third mask hole MH3 may be deposited on the first sub-functional layer 181 and the second sub-functional layer 182 to form the opposite electrode layer 190. The material that proceeds to the transmission area TA among the materials that passed through the third mask hole MH3 does not form a layer due to the surface energy control layer 170 exposed through the opening 181OP of the first sub-functional layer 181.

Referring to FIG. 12, the opposite electrode layer 190 may be formed with a thickness in the pixel area PA. In the display area DA, the opposite electrode layer 190 is continuously formed in the widthwise direction (e.g., the x direction), and thus, a continuous interface may be formed in the widthwise direction between the opposite electrode layer 190 and a layer adjacent to the opposite electrode layer 190. For example, an interface between the opposite electrode layer 190 and the second sub-functional layer 182 in the display area DA may be continuously formed in the widthwise direction.

As shown in FIG. 13A, the material constituting the opposite electrode layer 190 (see FIG. 11) is substantially not in the transmission area TA by the surface energy control layer 170, or as shown in FIG. 13B, only a small amount of the material constituting the opposite electrode layer 190 is located in the transmission area TA, and a layer (film) corresponding to the opposite electrode layer 190 (see FIG. 11) is not formed in the transmission area TA.

Ideally, the same material as the material constituting the opposite electrode layer 190 (see FIG. 11) may not be in the transmission area TA, but because the opposite electrode layer 190 (see FIG. 11) is formed through the open mask, as shown in FIGS. 13A and 13B, a small amount or a very small amount of aggregates 190A may be in the transmission area TA. The aggregates 190A are particles and may have different shapes and/or diameters. The aggregates 190A may include the same material as the opposite electrode layer 190 (see FIG. 11). The aggregates 190A are discontinuously and/or randomly arranged in the widthwise direction, and thus, a portion of the surface energy control layer 170 corresponding to the transmission area TA may be exposed through spaces between the aggregates 190A.

Referring back to FIG. 11, a stacked structure of the pixel electrode layer 140, the first functional layer 150, the emission layer 160, the surface energy control layer 170, the second functional layer 180, and the opposite electrode layer 190 in the pixel area PA may form an organic light-emitting diode OLED. Light (or first light L1) generated from the organic light-emitting diode OLED may be emitted to the outside.

Like the pixel area PA, the circuit element PC and the emission layer 160 may not be located in the transmission area TA. For example, the surface energy control layer 170 of the organic light-emitting diode OLED may be in the pixel area PA and the transmission area TA, but a minimum stacked structure for emitting light, for example, a stacked body of the pixel electrode layer 140, the emission layer 160, and the opposite electrode layer 190 is not in the transmission area TA. In some embodiments, as shown in FIG. 11, the first functional layer 150 and the surface energy control layer 170 are in the pixel area PA and in the transmission area TA, but the pixel electrode layer 140, the emission layer 160, the second functional layer 180, and the opposite electrode layer 190 are not in the transmission area TA.

Layers including metal among materials constituting the organic light-emitting diode OLED, for example, the second sub-functional layer 182 and the opposite electrode layer 190, are substantially not formed in the transmission area TA, and thus, a transmittance of the transmission area TA may be greatly improved through a relatively simple process as described above.

FIG. 11 illustrates that first light L1 of the organic light-emitting diode OLED arranged in the pixel area PA and external light (or second light L2) through the transmission area TA proceed in a direction (e.g., a z direction) from a rear surface 100R toward a front surface 100F of the substrate 100, but the embodiment is not limited thereto. In another embodiment, the first light L1 and the second light L2 may proceed in a direction (e.g., a -z direction) from the front surface 100F toward the rear surface 100R of the substrate 100.

According to the process described with reference to FIGS. 4 to 11, a structure in which the second sub-functional layer 182 and the opposite electrode layer 190 are formed on the first sub-functional layer 181 in the pixel area PA is provided, but in another embodiment, the second sub-functional layer 182 may not be formed. For example, in the pixel area PA, the opposite electrode layer 190 may be directly formed on the first sub-functional layer 181.

Figure 14:
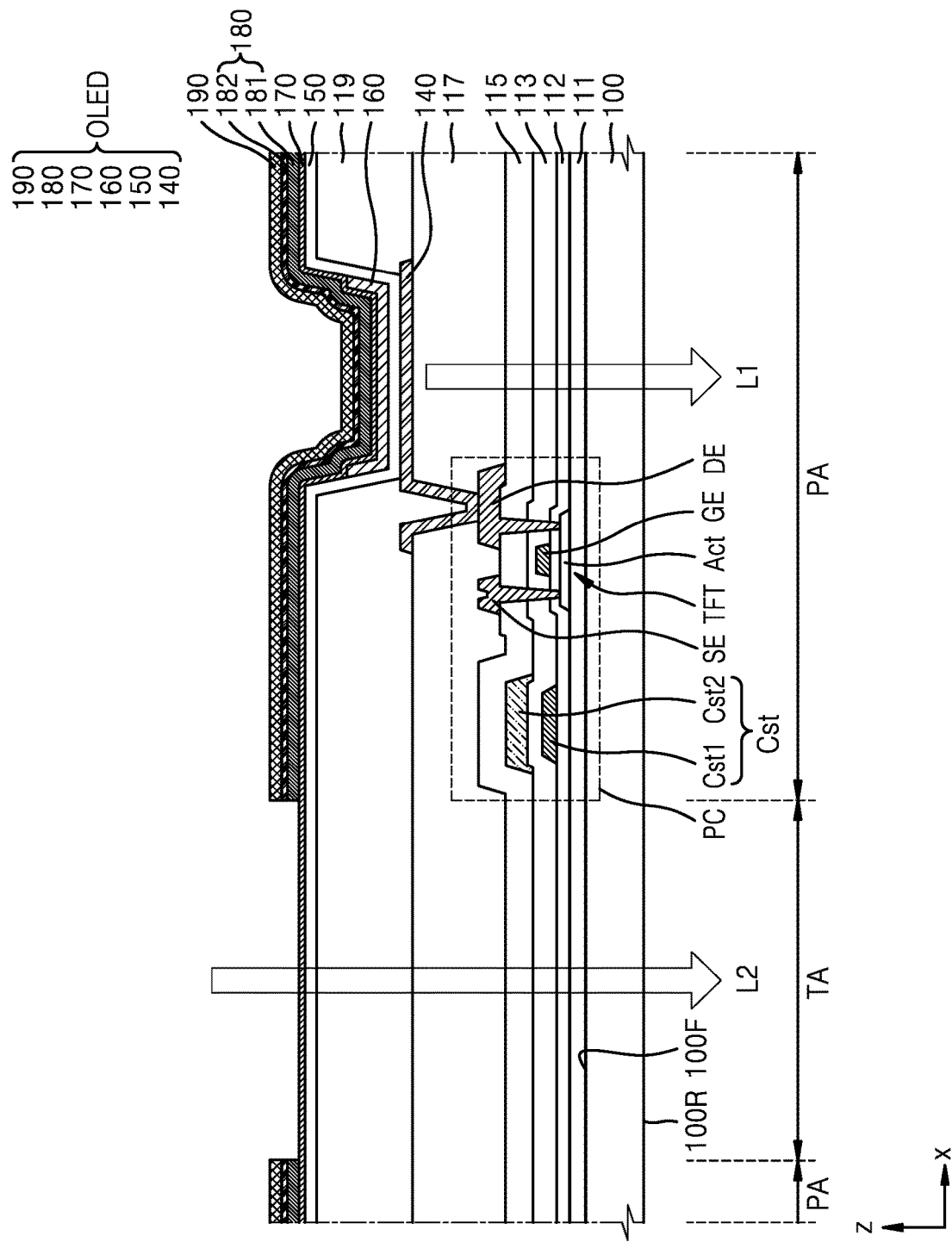
FIG. 14 is a schematic cross-sectional view of a display device according to an embodiment.

FIG. 14 is a schematic cross-sectional view of a display device according to an embodiment.

The display device of FIG. 14 may include the pixel area PA in which the circuit element PC and the organic light-emitting diode OLED are arranged, and the transmission area TA, and characteristics and processes of the circuit element PC and the organic light-emitting diode OLED are substantially the same as described above with reference to FIGS. 4 to 13. In terms of differences, the pixel electrode layer 140 of FIG. 14 may include a transmissive electrode including a transparent conductive layer such as ITO, and the opposite electrode layer 190 may include a reflective electrode including Ag, Mg, Al, Ni, Cr, Li, Ca, or an alloy thereof.

As shown in FIG. 14, the first light L1 of the organic light-emitting diode OLED arranged in the pixel area PA may proceed in the direction (e.g., the -z direction) from the front surface 100F toward the rear surface 100R of the substrate 100. A stacked structure of the transmission area TA in FIG. 14 is as described above, and the external light, the second light L2, may pass through the transmission area TA.

Figure 15:
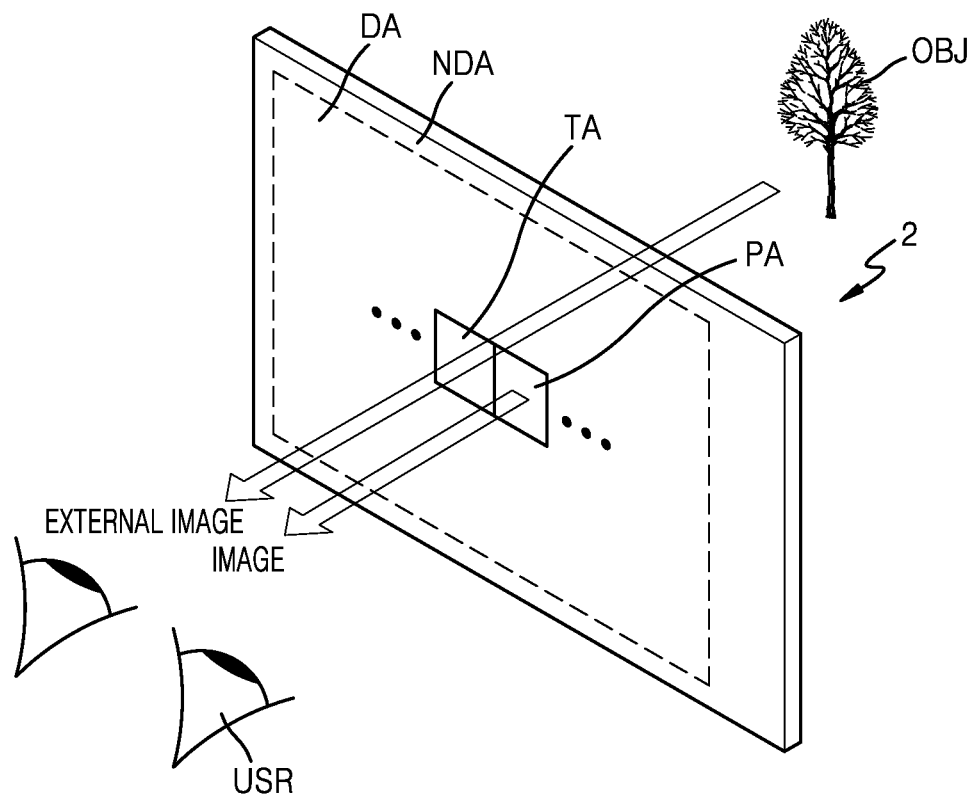
FIG. 15 is a schematic perspective view of an electronic apparatus including a display device, according to an embodiment.

FIG. 15 is a schematic perspective view of an electronic apparatus 2 including a display device, according to an embodiment.

Referring to FIG. 15, the electronic apparatus 2 may be a transparent electronic display apparatus such as a head-up display. The electronic apparatus 2 may include the display device including the display area DA and the non-display area NDA, described above with reference to FIGS. 1 to 14. The display area DA of the electronic apparatus 2 may include a structure in which the transmission areas TA and the pixel areas PA are repeatedly arranged.

A user USR may recognize an image implemented through light of light-emitting diodes arranged in the pixel area PA of the electronic apparatus 2, and recognize an external image, for example, an image of an object OBJ, located on the opposite side of the user USR with the electronic apparatus 2 therebetween.

Figure 16A:
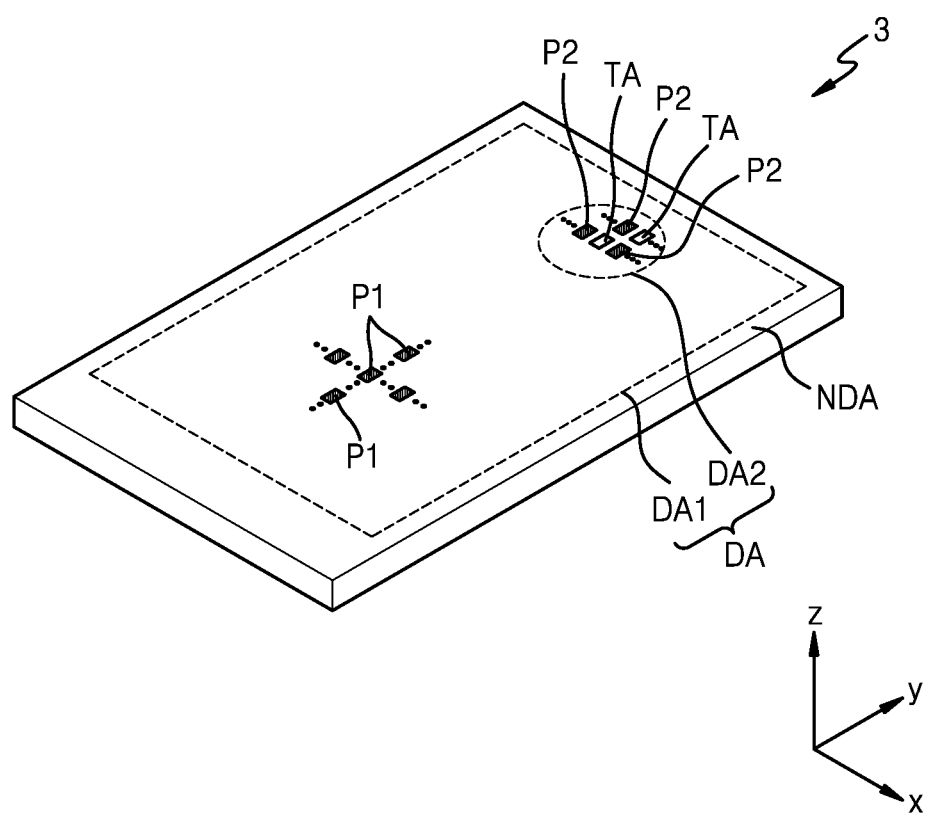
FIGS. 16A and 16B are schematic perspective views of an electronic apparatus including a display device, according to an embodiment.
Figure 16B:
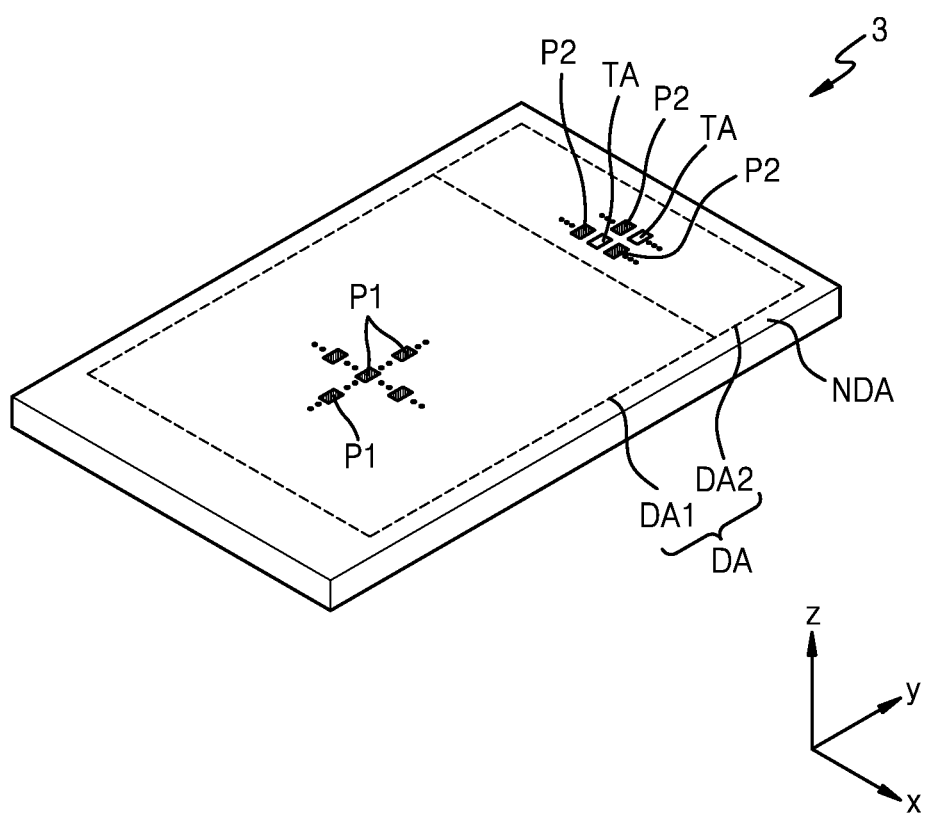

FIGS. 16A and 16B are schematic perspective views of an electronic apparatus 3 including a display device, according to an embodiment.

Referring to FIGS. 16A and 16B, the electronic apparatus 3 may include the display device including the display area DA and the non-display area NDA, described above with reference to FIGS. 1 to 14.

The display area DA of the electronic apparatus 3 includes the transmission area TA, and the transmission area TA may be only in a portion of the display area DA. For example, the display area DA may include a first display area DA1 in which pixels (hereinafter, referred to as first pixels P1) are arranged and a second display area DA2 in which pixels (hereinafter, referred to as second pixels P2) and the transmission areas TA are arranged.

The second display area DA2 may be entirely surrounded by the first display area DA1 as shown in FIG. 16A or partially surrounded by the first display area DA1 as shown in FIG.16B.

Figure 17:
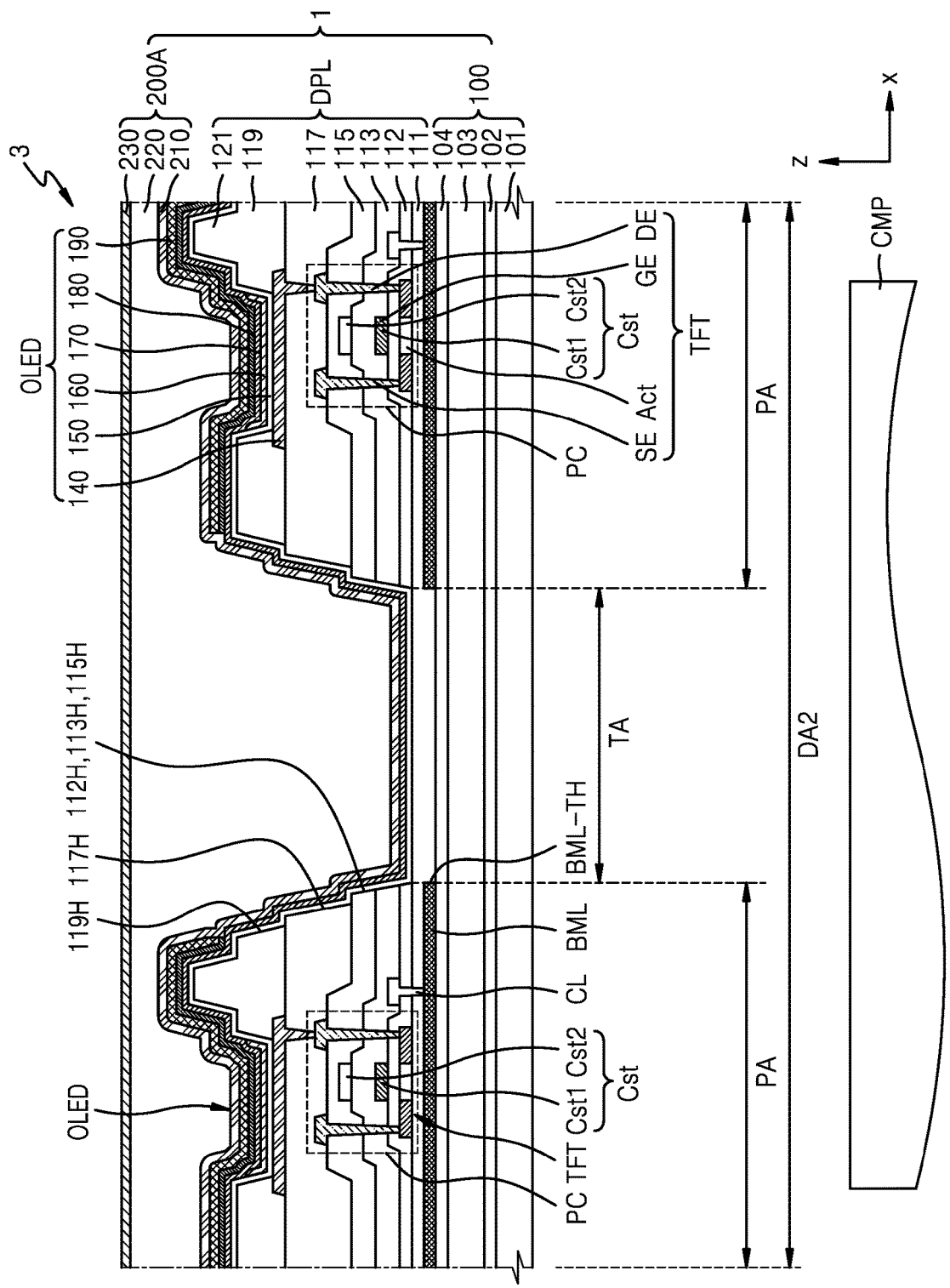
FIG. 17 is a schematic cross-sectional view of an electronic apparatus according to an embodiment.

FIG. 17 is a schematic cross-sectional view of an electronic apparatus 3 according to an embodiment.

Referring to FIG. 17, the electronic apparatus 3 may include the display device 1 and a component CMP. The display device 1 may include the substrate 100 and the display layer DPL on the substrate 100, and the display layer DPL may be covered by an encapsulation layer. FIG. 17 illustrates that the encapsulation layer includes a thin-film encapsulation layer 200A including a first inorganic encapsulation layer 210, an organic encapsulation layer 220, and a second inorganic encapsulation layer 230.

The first and second inorganic encapsulation layers 210 and 230 each may include one or more inorganic insulating materials. The inorganic insulating materials may include aluminum oxide, titanium oxide, tantalum oxide, hafnium oxide, zinc oxide, silicon oxide, silicon nitride, and/or silicon oxynitride. The organic encapsulation layer 220 may include a polymer-based material. Examples of the polymer-based material may include acrylic resin, epoxy resin, polyimide, polyethylene, etc. For example, the organic encapsulation layer 220 may include an acrylic resin, for example, polymethyl methacrylate, polyacrylic acid, etc.

The substrate 100 may include a first base layer 101, a first barrier layer 102, a second base layer 103, and a second barrier layer 104.

The first base layer 101 and the second base layer 103 each may include a polymer resin. The polymer resin may include PES, PAR, PEI, PEN, PET, PPS, PI, polycarbonate, TAC, CAP, etc.

The polymer resin may be transparent.

The circuit element PC may be arranged on the substrate 100, and the circuit element PC may include the thin-film transistor TFT and the storage capacitor Cst. The semiconductor layer Act, the gate electrode GE, the source electrode SE, and the drain electrode DE of the thin-film transistor TFT, and the first capacitor plate Cst1 and the second capacitor plate Cst2 of the storage capacitor Cst are as described above. In some embodiments, the storage capacitor Cst may overlap the thin-film transistor TFT. For example, the gate electrode GE may include the first capacitor plate Cst1 of the storage capacitor Cst.

A metal layer BML may be between the substrate 100 and the circuit element PC, for example, between the substrate 100 and the buffer layer 111. The metal layer BML is located in the second display area DA2 and may prevent the circuit element PC from being damaged by light toward the component CMP or emitted from the component CMP.

The metal layer BML may include a through hole BML-TH corresponding to the transmission area TA. The metal layer BML may include conductive material such as Al, Pt, Pd, Ag, Mg, Au, Ni, Nd, Ir, Cr, Ni, Ca, Mo, Ti, W, and/or Cu.

The metal layer BML may be electrically connected to a connection line CL. The connection line CL may be electrically connected to the gate electrode GE, the source electrode SE, or the drain electrode DE of the thin-film transistor TFT, or may be electrically connected to one of the capacitor plates of the storage capacitor Cst. In other embodiments, the connection line CL may be electrically connected to a line that supplies the first power voltage ELVDD (see FIG. 3).

In the pixel area PA, the organic light-emitting diode OLED may include the pixel electrode layer 140, the first functional layer 150, the emission layer 160, the surface energy control layer 170, the second functional layer 180, and the opposite electrode layer 190, and characteristics of the respective layers are as described above with reference to FIG. 11 or the like.

The first functional layer 150 and the surface energy control layer 170 may extend into the transmission area TA, but the second functional layer 180 and the opposite electrode layer 190 may be substantially not in the transmission area TA, as described above with reference to FIGS. 8 to 13.

In order to improve the transmittance of the transmission area TA, the insulating layers, for example, the gate insulating layer 112, the first interlayer insulating layer 113, and the second interlayer insulating layer 115, the planarization insulating layer 117, and/or the upper insulating layer 119, which are arranged on the substrate 100, may include holes 112H, 113H, 115H, 117H, and 119H, which overlap each other in the transmission area TA. In some embodiments, the buffer layer 111 on the substrate 100 may also include a hole corresponding to the transmission area TA.

The component CMP may include an electronic element using light. Examples of the electronic element may include a sensor that measures a distance, such as a proximity sensor, a sensor that recognizes a part of a user's body (e.g., a fingerprint, an iris, a face, etc.), a small lamp that outputs light, and an image sensor (e.g., a camera) that captures an image. The electronic element using light may use light in various wavelength bands such as visible light, infrared light, ultraviolet light, etc. In an embodiment, the component CMP may overlap the transmission area TA.

The electronic apparatuses 2 and 3 described with reference to FIGS. 15 to 17 may include various types of electronic apparatuses such as head-up display electronic apparatuses, mobile phones, or display electronic apparatuses for vehicles.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
a pixel area and a transmission area adjacent to the pixel area;
a circuit element disposed in the pixel area and including a transistor and a capacitor;
a pixel electrode layer disposed in the pixel area and electrically connected to the circuit element;
an emission layer disposed on the pixel electrode layer;
an opposite electrode layer disposed on the emission layer; and
a surface energy control layer disposed between the emission layer and the opposite electrode layer and including a perfluorinated material, wherein
the surface energy control layer has a portion extending into the transmission area.

2. The display device of claim 1, wherein the opposite electrode layer does not overlap the transmission area.

3. The display device of claim 1, further comprising an aggregate particle disposed on the surface energy control layer and including a metal element.

4. The display device of claim 1, wherein the opposite electrode layer includes silver (Ag), magnesium (Mg), aluminum (Al), nickel (Ni), chromium (Cr), lithium (Li), calcium (Ca), or an alloy thereof.

5. The display device of claim 1, further comprising an electron transport layer disposed between the surface energy control layer and the opposite electrode,
wherein the electron transport layer includes an opening corresponding to the transmission area.

6. The display device of claim 1, further comprising an electron injection layer disposed between the surface energy control layer and the opposite electrode,
wherein the electron injection layer includes a metal.

7. The display device of claim 6, wherein the electron injection layer does not overlap the transmission area.

8. The display device of claim 7, wherein the metal of the electron injection layer includes an alkali metal, an alkaline earth metal, or a lanthanide metal.

9. The display device of claim 1, wherein a thickness of the surface energy control layer is less than a thickness of the emission layer.

10. The display device of claim 1, wherein a surface energy of the surface energy control layer is less than or equal to about 20 mJ/m$^2$.

11. An electronic apparatus comprising a display device, wherein the display device comprises:
a pixel area in which pixels are disposed and a transmission area adjacent to the pixel area;
a pixel electrode layer disposed in the pixel area;
an opposite electrode layer overlapping the pixel electrode layer in the pixel area and including a metal;
an emission layer disposed between the pixel electrode layer and the opposite electrode layer;
a surface energy control layer disposed between the emission layer and the opposite electrode layer, a portion of the surface energy control layer extending into the transmission area; and
a first sub-functional layer disposed between the surface energy control layer and the opposite electrode layer and including an organic material,
wherein the first sub-functional layer includes an opening corresponding to the transmission area.

12. The electronic apparatus of claim 11, wherein a surface energy of the surface energy control layer is less than or equal to about 20 mJ/m$^2$.

13. The electronic apparatus of claim 11, wherein the surface energy control layer includes a perfluorinated material.

14. The electronic apparatus of claim 11, wherein the opposite electrode layer includes silver (Ag), magnesium (Mg), aluminum (Al), nickel (Ni), chromium (Cr), lithium (Li), calcium (Ca), or an alloy thereof.

15. The electronic apparatus of claim 11, wherein the opposite electrode layer does not overlap the transmission area.

16. The electronic apparatus of claim 11, further comprising an electron injection layer disposed between the surface energy control layer and the opposite electrode layer, wherein the electron injection layer includes a metal.

17. The electronic apparatus of claim 16, further comprising an aggregate particle disposed on the surface energy control layer,
wherein the aggregate particle includes a metal element.

18. The electronic apparatus of claim 17, wherein the metal element of the aggregate particle includes a metal element included in the opposite electrode layer or a metal element included in the electron injection layer.

19. The electronic apparatus of claim 16, wherein the metal of the electron injection layer includes an alkali metal, an alkaline earth metal, or a lanthanide metal.

20. The electronic apparatus of claim 11, wherein a thickness of the surface energy control layer is less than a thickness of the emission layer.

21. The electronic apparatus of claim 11, further comprising a component overlapping the transmission area.

22. The electronic apparatus of claim 21, wherein the component includes a sensor or a camera.

23. The electronic apparatus of claim 11, wherein the electronic apparatus includes a head-up display electronic apparatus, a mobile phone, or a display electronic apparatus for vehicles.

* * * * *